United States Patent [19]

Brewer et al.

[11] Patent Number: 5,379,000
[45] Date of Patent: Jan. 3, 1995

[54] ATOMIC CLOCK EMPLOYING ION TRAP OF MONO- OR MULTI-PLANAR GEOMETRY

[75] Inventors: Richard G. Brewer; Ralph G. Devoe, both of Palo Alto; Kenneth L. Foster, Los Gatos; John A. Hoffnagle, Morgan Hill, all of Calif.; Reinald Kallenbach, Bern, Switzerland

[73] Assignee: International Business Machines Corporation, Armonk, N.Y.

[21] Appl. No.: 81,505

[22] Filed: Oct. 30, 1992

Related U.S. Application Data

[60] Division of Ser. No. 883,798, May 12, 1992, Pat. No. 5,248,883, which is a continuation-in-part of Ser. No. 710,188, May 30, 1991, abandoned.

[51] Int. Cl.⁶ .............................................. H03L 7/26
[52] U.S. Cl. ...................................... 331/3; 313/293; 313/301; 315/151; 315/158; 315/248; 315/307
[58] Field of Search ............... 331/3, 184; 313/110, 313/153, 154, 155, 160, 162, 553, 230, 293, 296, 301; 315/326, 151, 158, 248, 307

[56] References Cited
U.S. PATENT DOCUMENTS
5,192,921  3/1993  Chantry et al. ............... 331/3

*Primary Examiner*—David Mis
*Attorney, Agent, or Firm*—James C. Pintner; Bo-In Lin

[57] ABSTRACT

An atomic clock system employs one of a family of ion trap configurations confining an ion in a potential well, such that a vibrational frequency confined ion may be measured accurately. The ion traps disclassed for use in such atomic clock systems include configurations of ring-shaped conductive members, or sheets of conductive material having circular holes therein. The trap apparatus further has a means to apply an RF field such that the resulting electric field being generated in a space defined by the conductive members has a characteristic of a substantially quadrupole field whereby a charged particle, being injected into the space, is confined in said field, maintaining a dynamic equilibrium condition.

4 Claims, 13 Drawing Sheets

1000V PEAK AT 150 MHZ APPLIED TO TRAP

ATOMIC CLOCK EMPLOYING ION TRAP OF MONO- OR MULTI-PLANAR GEOMETRY

This is a division of application Ser. No. 07/883,798, filed May 12, 1992, now U.S. Pat. No. 5,248,883; which is a continuation-in-part of application Ser. No. 07/710,188, filed May 30, 1991, now abandoned.

FIELD OF THE INVENTION

This invention relates to the electromagnetic confinement of charged particles and, more particularly, to planar ion traps and ion trap devices, e.g., ion trap atomic clocks and mass spectrometers.

BACKGROUND OF THE INVENTION

Experimental physics has long been exploring different ways of containing charged or neutral particles in an isolated space, either for precision measurements of the fundamental constants or for monitoring their interactions. As is well known, the theoretical description of atoms or elementary particles is in the domain of quantum mechanics. In the late 1930s, out of molecular-beam physics, mass spectrometry and particle physics grew the idea of building a trap to suspend charged particles without a material wall. A more systematic study began in the early 1950s, focusing on the use of a multipole electric field for "trapping" and storing particles for a prolonged period of time.

There are two major types of traps which have been used to trap ions for the purpose of conducting precision measurements. The first type is the Paul trap, often identified as the RF trap (W. Paul, Rev. Mod. Phys. 62, 531, 1990). It uses hyperbolic electrodes in a vacuum apparatus. These electrodes, symmetric about a vertical axis, consist of one ring electrode and two endcap electrodes and all three electrodes are of hyperboloid geometry (see FIG. 1). An alternating voltage of a certain frequency is applied between the endcap and the ring electrodes. An ion injected into the space defined by these electrodes is therefore subject to an RF electric field such that its cyclic motion in response to the alternating voltage, i.e., micromotion, is 180 degrees out of phase with respect to the electric force. Because the electric field is inhomogeneous, the force averaged over one period of one micromotion is in the direction of the weaker field amplitude, i.e., toward the center of the trap, independent of the sign of the charge. Thus, a "pseudo-potential well" is generated to confine the ion.

The second type of ion trap is the Penning trap which uses the same electrode configuration as the Paul trap. Instead of an RF voltage as used in the Paul trap, a static potential is applied between the ring and the endcaps which generates a static potential well in the vertical axis. Meanwhile, a repulsive potential in the horizontal plane is generated which is then overcome by superimposing a static magnetic field along the vertical axis. The horizontal motion of the trapped ions is a composite of circular cyclotron orbits primarily due to the magnetic field and a circular drift magnetron motion in response to the cross product of the electric field and the magnetic field vectors, i.e., $E \times B$ about the vertical axis. The ion is thus confined in the space defined by the hyperbolic ring electrodes and the two endcaps.

Both the Paul and Penning traps can provide long term confinement of charged particles. It is not uncommon to store ions in the trap for days. There are several advantages arising from the long term storage when the ion trap is used for spectroscopy. The first advantage is the reduction of the minimum energy uncertainty in the frequency measurements as the result of "transit time broadening". The longer the ion is trapped, the less is the uncertainty in the energy measurement due to Heisenberg's uncertainty principle. A second advantage is the more accurate frequency measurement because of the reduction in Doppler shifts. As the trapping time increases, the average velocity of the trapped ion asymptotically approaches zero. According to the Lamb-Dicke's theory, when the dimension of the confinement is sufficiently small, the long duration of confinement can make the first-order Doppler frequency shift negligible. Furthermore, a laser cooling technique was developed by Dehmelt and Wineland in 1975 (Phys. Rev. Let. 41, 233, 1978), and also by Haensch and Schawlow (Opt. Comm. 13, 68, 1975) by which the trapped ions can be "cooled" to very low energies close to absolute zero temperature whereby the second-order Doppler shifts are reduced. A very high degree of accuracy in frequency measurement for the trapped ions can therefore be achieved. The confinement of ions at low energy in an isolated and unperturbed condition for a long duration allows one to make more precise clocks and to perform various kinds of extremely sensitive atomic and nuclear measurements.

One important application of ion traps is in improving the performance of atomic clocks or frequency standards. Atomic clocks play an indispensable role in modern electronic technology and also have important applications in pure research. The principle of an atomic clock is to servo control a conventional frequency standard, for example, a quartz crystal oscillator, so that its frequency resonates with an atomic energy level splitting which, according to the principles of quantum mechanics, is immutable and the same for all atoms. Current devices measure the energy level splitting of cesium atoms in an atomic beam. The accuracy of the cesium clock is however limited because the cesium atoms in the atomic clock move at a speed of several hundred meters per second through the apparatus. These moving atoms have a distribution of velocities which broadens and shifts the atomic resonance due to the Doppler effect. An additional source of broadening is caused by "transit time broadening". It occurs because the atoms spend no more than a few milliseconds in the measuring apparatus. Due to these effects, the accuracy of commercial atomic clocks is limited to about $10^{-11}$ while laboratory devices can reach $10^{-14}$.

Trapped ion atomic clocks are in principle more accurate than atomic beam clocks because the atoms are essentially stationary. Since the observation time can be indefinitely long, transit time broadening is eliminated. Doppler shifts similarly can average to zero so that clock accuracies can be improved by several orders of magnitude to the $10^{-15}$ to $10^{-18}$ range. This improved accuracy is immediately useful in communications and navigation.

Trapped ion clocks, both with and without laser cooling, have already been constructed by several groups. (see L. S. Cutler et. al. Appl. Phys B39, 251 1986), and J. J. Bollinger et. al. Phys. Rev. Letters 54, 1000 1985). FIG. 2 shows an atomic energy level diagram utilized in a laser-cooled clock as initially proposed and demonstrated by Dehmelt (see IEEE Trans. on Inst. & Meas. 1M-31, p. 83, (1982). As shown in FIG. 2, the three atomic energy levels form two coupled energy transition systems, i.e., a "cooling transition" between levels 1 and 2, and a "clock transition" between levels 1 and 3. The ion is chosen so that the clock transition, i.e., the energy shift between energy levels 1 and 3, is extremely narrow and insensitive to environmental perturbations. It determines the stability and accuracy of the clock. The cooling transition, on the other hand, is used to detect the state of the clock transition and also can be used for laser cooling the atom. It has only an indirect effect on the accuracy of the clock.

A block diagram of a typical laser-cooled clock is shown in FIG. 3. Laser beam 6 drives the cooling transition and microwave source 8 drives the clock transition. As shown in FIG. 3, the confined ion 10 is irradiated with laser beam 6, which is selected and controlled to have a frequency corresponding to the energy shift between energy levels 1 and 2. In absorbing laser beam photons 6, confined ion 10 is pumped to level 2, causing a spontaneous emission of scattered photons 12 which are detected by photodetector 14. When microwave source 8 resonates with the clock transition between levels 1 and 3, it drives confined ion 10 to energy level 3 in FIG. 2. At energy level 3, confined ion 10 is not absorbed by laser beam 6, thereby maintaining its energy level at level 3, which in turn reduces scattered photons 12 emitted by the cooling transition between energy levels 1 and 2. Thus, the three-level system acts as a quantum amplifier where the resonance in the weak clock transition produces a large change in the light scattered from the strong cooling transition. This signal is detected by photo-detector 14 and used to control a servo loop which locks microwave source 8 to the atomic clock frequency. The output of the device is then the microwave signal servo locked to the atomic clock transition. Note that although a microwave clock transition is shown in FIG. 2, the system also works equally well with an optical clock transition.

Several limitations on the performance of the Paul trap and the Penning trap have become apparent in recent years. The three-dimensional hyperbolic metallic electrodes for accurate generation of the quadrupole electric field are difficult to machine for large-scale manufacturing. Beatty showed in 1978 (Phys. Rev. A33, 3645, 1986) how the hyperboloids of revolution could be replaced by conical electrodes and still retain a field which remained quadrupole up to the eighth order. However, the conical electrodes are still difficult to fabricate. The Penning trap has another limitation because of the use of crossed electrostatic and magnetic fields. The requirement of a magnetic field not only places a burden on the space utilization near the ion trap and the complexity of the electric circuitry, but also the magnetic field is difficult and expensive to generate. It is for these reasons that broader applications of ion trap technology in the scientific and engineering communities have been severely restricted.

A second contributing limitation of the prior art is the inability to manufacture small traps. It is well known in the art that the field strength of a trap is inversely related to its trap size. Trap performance thus depends on the ability to machine complex parts no larger than a few thousandths of an inch in dimension. Mass fabrication is not feasible with the hyperboloid electrodes required by both the Paul and Penning traps.

Another limitation faced by the prior art is the breakdown voltage of the trap. This limits the strength of the trap potential and indirectly the trap size. It is well known that conventional machined electrodes break down at voltages which are factors of 10 to 1000 lower than that which was predicted by the Fowler-Nordheim theory of quantum mechanics (Germian and Rohrbach, Vacuum 18, 371, 1967). This is because machined electrodes inevitably contain a few small protrusions on the order of 1 micron in size which enhance the electric field by factors of 10 to 1000 and initiate the breakdown. Traps made by photolithographic or semiconductor techniques, however, should have breakdown voltages several orders of magnitude higher than those made with machined electrodes. This is because photolithographic electrodes are smooth on the micron scale and obey the Fowler-Nordheim law. Consequently, they should withstand electric fields of about $10^6$ volts/cm rather than $10^4$ volts/cm which is customary for conventional trap designs. Since the trapping potential is proportional to the square of the applied voltage, photolithographic traps can be far stronger or smaller than conventional traps. However, photolithography is most successful when used to make planar structures; conical or cylindrical shapes can be made only with great difficulty. Hence, planar traps are a natural choice for photolithography.

Another limitation of the prior art is a quantum limit on single-atom clock performance as pointed out by Wineland in 1981 (Wineland et. al., Phys. Rev. A36, 2220, 1987) that for optimum performance of the atomic clock, many separate single-atom clocks should be operated simultaneously. However, the difficulty of constructing such micro clocks has made the practicality of this approach questionable.

SUMMARY OF THE INVENTION

For the aforementioned reasons, it is therefore the object of this invention to teach a method to fabricate ion traps in a manner that is simple both in design and in manufacture such that mass production and low cost application of the ion trap technology would become possible in the industry and scientific communities.

Specifically, one object of the present invention is to teach a method to mass produce the entire atomic clock assembly. Since not only the ion trap itself but also other devices needed to construct an atomic clock such as laser diodes, photodiodes, optical waveguides, and microwave oscillators have also been mass produced by semiconductor techniques, it would be possible to mass produce an entire atomic clock assembly, thereby greatly reducing its cost.

Additionally, it is another object of this invention to design and fabricate an ion trap which is small in dimension down to the level of submicron range such that the strength of the ion trap field can be increased by 10 to 100 times relative to that achievable in the prior art.

Furthermore, it is another object of this invention to teach a manufacturing technique that would enable those who are skilled in the art to fabricate multiple ion traps in the form of arrays by taking advantage of the modern integrated circuit (IC) manufacturing processes such that a more accurate clock can be realized.

Lastly, it is another object of the present invention to teach a multipole configuration which is more open and accessible such that the loading of the ions into the trap is easier. Also, the laser cooling is more effective and the monitoring and measuring of the ion behaviors can be better performed because there is a larger solid angle for photon scattering and more space are available for the placement of the laser equipment and detectors.

To achieve these objects, ion traps of planar configurations are taught in the present invention. The invention was made on the bases of both analytical derivations and numerical solutions applying commercially available computer programs. They were then demonstrated and confirmed by experiments carried out in the laboratory. The section on the "Preferred Embodiment" below provides complete detailed discussions. Specifically, this invention teaches eight basic planar configurations. Additionally, this invention teaches arrays and apparatuses implementing arrays or combinations of these basic configurations. These basic planar ion trap configurations generate an electrical field having substantially the characteristics of a quadrupole field capable of storing the charged particles for a prolonged duration. These configurations as described below not only overcome the limitations encountered in the prior art but also achieve the aforementioned purposes of this invention.

The first basic planar configuration is a one-hole trap which comprises three parallel, electrically conductive sheets separated by dielectrics disposed on the outer edges of said sheets, the inner sheet having a circular hole. The one-hole trap further has a means to apply an RF field between the center sheet and the two outer sheets such that the resulting electric field being generated in the space defined by the circular hole and the two outer sheets has a characteristic of a substantially quadrupole field, whereby a charged particle in being injected into the space is confined in said field, maintaining a dynamic equilibrium condition.

The second basic planar configuration is a three-hole trap which comprises three parallel, electrically conductive sheets separated by dielectrics disposed on the outer edges of said sheets, each of the three sheets having a circular holes and said circular holes is symmetrically aligned substantially along a common axis. The three-hole trap further has a means to apply an RF field between the center sheet and the two outer sheets such that the resulting electric field being generated in the space defined by the three aligned circular holes has a characteristic of a substantially quadrupole field, whereby a charged particle in being injected into the space is confined in said field, maintaining a dynamic equilibrium condition.

The third basic planar configuration is a concentric-ring trap which comprises an outer ring and at least one inner ring made of electrically conductive material disposed on a same plane, these multiple rings being aligned substantially concentric along a common axis. The concentric-ring trap further has a means for impressing an RF potential in between any two rings. A resulting electric field is generated in a region above the plane of the multiple rings having a characteristic of a substantially quadrupole field, whereby a charged particle in being injected into the space floats above the rings and is confined in said field, maintaining a dynamic equilibrium condition.

The fourth basic planar configuration is a three-ring trap which comprises two outer rings and an inner ring made of electrically conductive material disposed on three substantially parallel planes, said three rings being aligned substantially concentric along a common axis. The three-ring trap also has a means for impressing an RF potential between the inner ring and the two outer rings. Furthermore, the two outer rings have radii of the same length, the inner ring has a greater radius, and the outer rings are maintained at the same distance from the inner ring. The spacing between the rings is adjusted as a function of the radii of the outer rings and the inner ring such that the resulting electric field being generated in the space defined by the three aligned rings has a characteristic of a substantially quadrupole field up to the eighth harmonic order, whereby a charged particle in being injected into the space is confined in said field, maintaining a dynamic equilibrium condition.

The fifth basic planar configuration is a two-ring trap which comprises two rings made of electrically conductive material disposed on two substantially parallel planes, said two rings being aligned substantially concentric along a common axis. The two-ring trap also has a means for impressing an RF potential between the two rings, which are electrically connected together so that they are at the same potential, and a distant ground electrode, whose shape is not critical. Furthermore, the two outer rings have radii of the same length. The spacing between the rings is adjusted as a function of the radii of the rings such that the resulting electric field being generated in the space between the rings has the characteristic of a substantially quadrupole field up to the sixth harmonic order, whereby a charged particle in being injected into the space is confined in said field, maintaining a dynamic equilibrium condition.

The sixth basic planar configuration is a four-ring trap which comprises two outer rings and two inner rings made of electrically conductive material disposed on four substantially parallel planes, said four rings being aligned substantially concentric along a common axis. The four-ring trap also has a means for impressing an-RF potential between the two inner rings, which are electrically connected together so that they are at the same potential, and the two outer rings, which are also connected together so that they are at the same potential. Furthermore, the two inner rings have radii of the same length and the two outer rings have radii of the same length. The spacing and radii of the inner and outer rings is adjusted such that the resulting electric field being generated in the space between the two inner rings has the characteristic of a substantially quadrupole field up to the sixth harmonic order, whereby a charged particle in being injected into the space is confined in said field, maintaining a dynamic equilibrium condition.

The seventh basic planar configuration is a two-hole trap which comprises two parallel, electrically conductive sheets, each sheet having a circular hole, the circular holes being symmetrically aligned substantially along a common axis. The sheets may be separated by dielectrics disposed on the outer edges of the sheets. The two-hole trap also has a means for impressing an RF potential between the two sheets, which are electrically connected together so that they are at the same potential, and a distant ground, whose shape is not critical. The spacing between the two sheets is adjusted as a function of the radii of the holes such that the electric field being generated in the space between the holes has the characteristic of a substantially quadrupole field up to the sixth harmonic order, whereby a charged particle in being injected into the space is confined in said field, maintaining a dynamic equilibrium Condition.

The eighth basic planar configuration is a four-hole trap which comprises four parallel, electrically conductive sheets, each sheet having a circular hole, the circular holes being symmetrically aligned substantially along a common axis. The two inner holes are of substantially the same radius and the two outer holes are also of substantially the same radius. The sheets may be separated by dielectrics disposed on the outer edges of the sheets. The four hole trap also has a means for impressing an RF potential between the two inner sheets, which are electrically connected together so that they are at the same potential, and the two outer sheets, which are also electrically connected together so that they are at the same potential. The spacing between the sheets is adjusted as a function of the radii of the holes such that the electric field being generated in the space between the inner holes has the characteristic of a substantially quadrupole field up to the sixth harmonic order, whereby a charged particle in being injected into the space is confined in said field, maintaining a dynamic equilibrium condition.

DESCRIPTION OF THE PREFERRED EMBODIMENT

Figure 4:
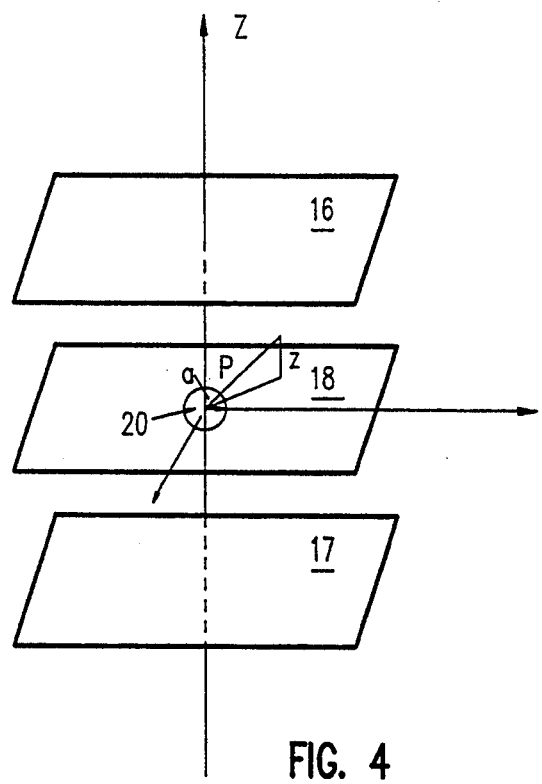
FIG. 4 shows a three-plane, one-hole trap having three parallel sheets with a circular hole on the inner sheet.

The planar ion-trap invention can be best explained by a theoretical analysis of the electrical field of a 'one-hole trap' as shown in FIG. 4. The geometry consists of three parallel sheets where the two outer sheets, i.e., sheets 16 and 17, are solid and the inner sheet, i.e., sheet 18 has a hole 20 with radius a. An electrical potential applied between the inner and outer sheets produces an electric field E if the hole were not present. With hole 18, the resulting potential is:

$$V(\epsilon, \zeta) = \epsilon E a [\zeta - (2/\pi)(\zeta \operatorname{ctn}^{-1}\zeta - 1)]$$

where the oblate spherical coordinates $\epsilon$ and $\zeta$ are defined in terms of cylindrical coordinates $\rho$ and $z$ (see FIG. 4).

$$\zeta^2 = 1/2[R^2 - 1 + \sqrt{((1-R^2)^2 + 4(z/a)^2)}\,]$$

$$\epsilon^2 = 1 - (\rho/a)^2/(1+\zeta^2)$$

$$R^2 = (\rho/a)^2 + (z/a)^2$$

THEOREM: The properties of Planar Paul traps can be generalized in the following theorem. First, note that the Legendre series $$\Phi(r, \theta) = \sum_{l=0}^{\infty} (a_l r^l + b_l/r^{l+1}) P_l(\cos \theta)$$

is a general solution to LaPlace's equation in spherical coordinates when cylindrical symmetry exists where the coefficients $a_l$ and $b_l$ depend on the boundary conditions. When the potential is also symmetric to reflection along the z axis, the $a_l$ terms are of even order in l. In addition, for an oscillating potential, the leading term $a_2 r^2 P_2(\cos \theta)$ is the quadrupole potential of a Paul trap and is responsible for stable ion trapping. Numerical solutions reveal that the higher order terms play a perturbative role that becomes significant only when the ion position approaches the characteristic trap dimension, resulting in a less stable trap. The $b_l$ terms correspond to the far field where ion scattering rather than trapping occurs and are of odd order. Hence any electrode configuration that satisfies cylindrical and axial symmetry can trap ions, the Paul and linear traps and configurations described here being examples.

The planar ion trap comes in two basic configurations: the "untuned" trap and the "tuned" trap. In both configurations the trap electrodes create a large quadrupole potential which generates tile linear electric field needed to trap the ions. This quadrupole field is generated by the $l=2$ term in the above Legendre series, that is, by the $r^2 P_2(\cos \theta)$ term, which also may be called the "harmonic" or "quadratic" term. In the untuned trap, no attempt is made to control the higher order terms in the potential, that is the fourth order term $r^4 P_4(\cos \theta)$, the sixth order term $r^6 P_6(\cos \theta)$, and so on. In some cases these higher order terms degrade trap performance, and in combination with other trap imperfections can even prevent the trap from working at all. Therefore an important feature of this invention is the discovery that the trap geometry can be "tuned" or adjusted to reduce or eliminate the higher order terms, especially the fourth-order and sixth-order terms, which are dominant in practice. At least seven different trap geometries have been found which cancel fourth order terms and at least one geometry which cancels both the fourth order and the sixth order terms. The common feature of the different species of tuned traps is that for certain values of ring or hole diameters, relative to the spacing between the planes containing the rings or holes, the fourth-order or sixth-order, or both, terms cancel.

In particular, the trap configuration illustrated in FIG. 11 and discussed below can be tuned so as to eliminate both the fourth- and sixth-order terms. A detailed discussion of this tuning appears below.

Figure 5:
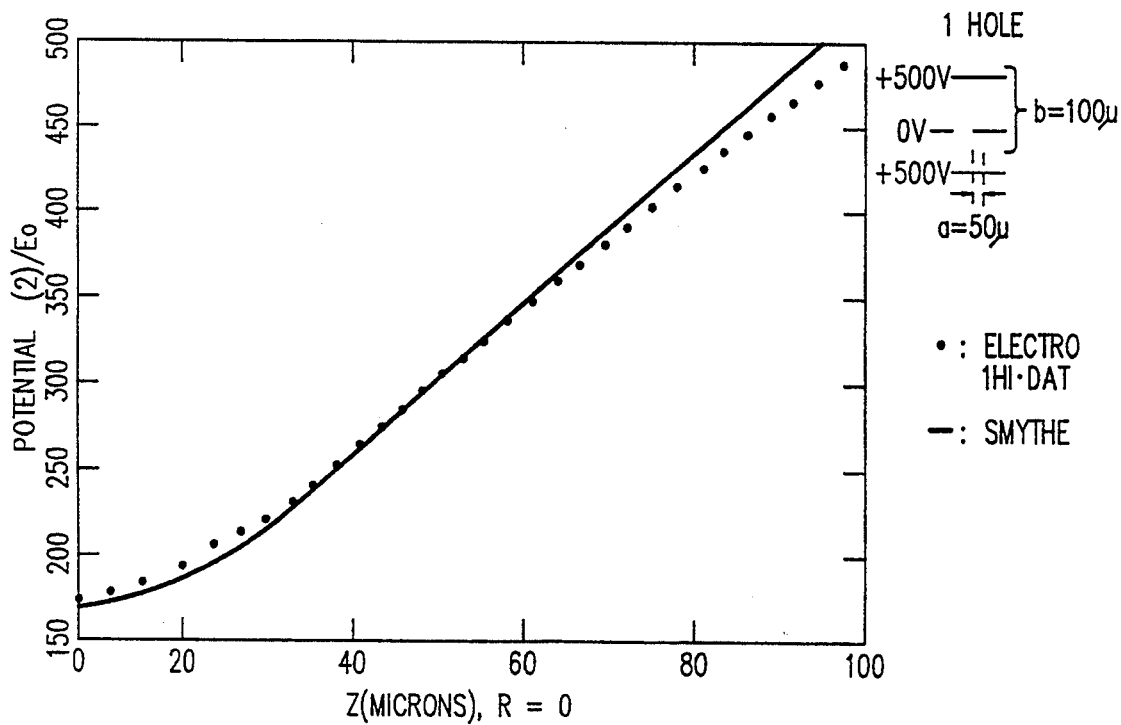
FIG. 5 shows the electric potential of the one-hole trap as a function of the distance from the center of the trap forming a potential well.

FIG. 5 depicts in a solid line the potential V predicted by equation (1) along the axial direction z where the radius a is 50 microns and a voltage of 500 volts is applied across sheets separated by 100 microns. Superimposed on this plot are the dotted lines representing the numerical solution of the Laplace equation. FIG. 5 not only shows that there is an excellent agreement between the prediction of equation (1) and the numerical analysis, but also demonstrates that an ion when injected into hole 20 will be trapped and remain confined in this "potential well".

Figure 6:
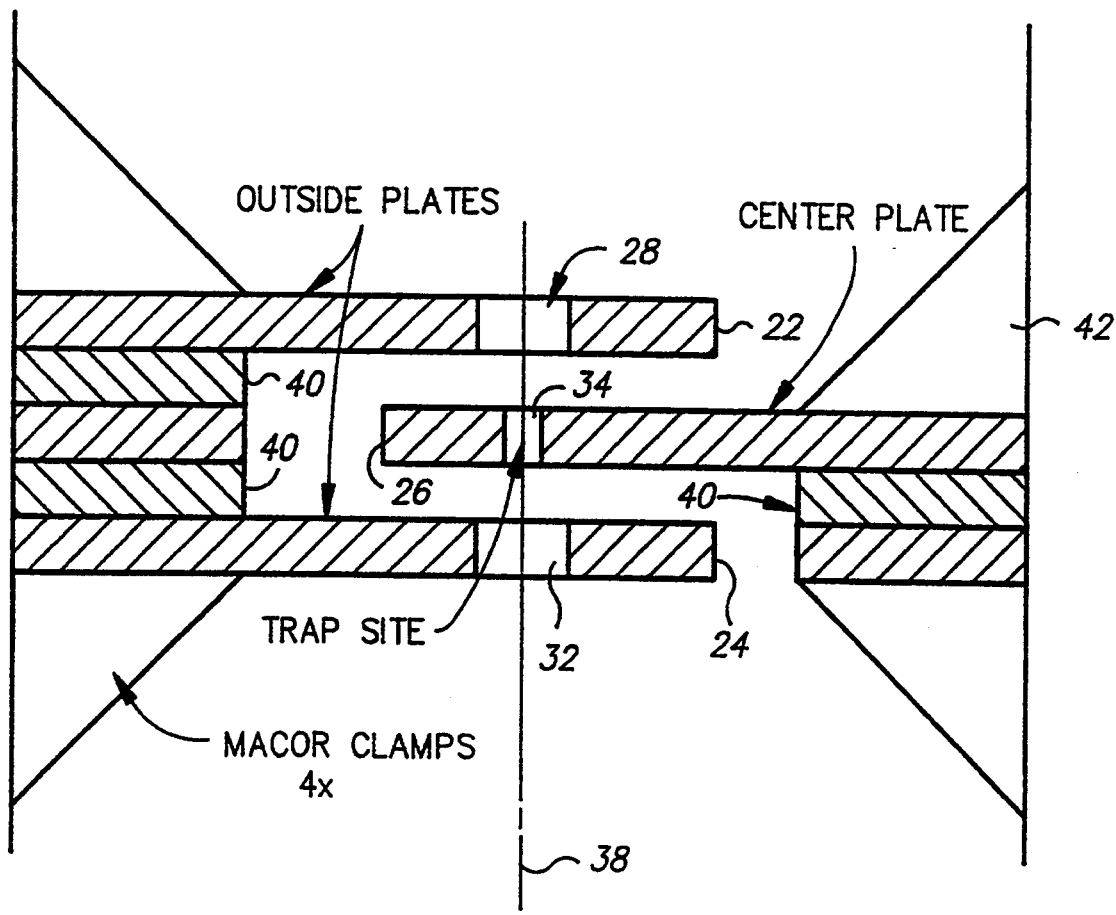
FIGS. 6 and 6A show a side view and a top view, respectively, of a three-hole ion trap having three parallel sheets, each having a circular hole with an ion trapped in the space defined by the three holes.
Figure 6A:
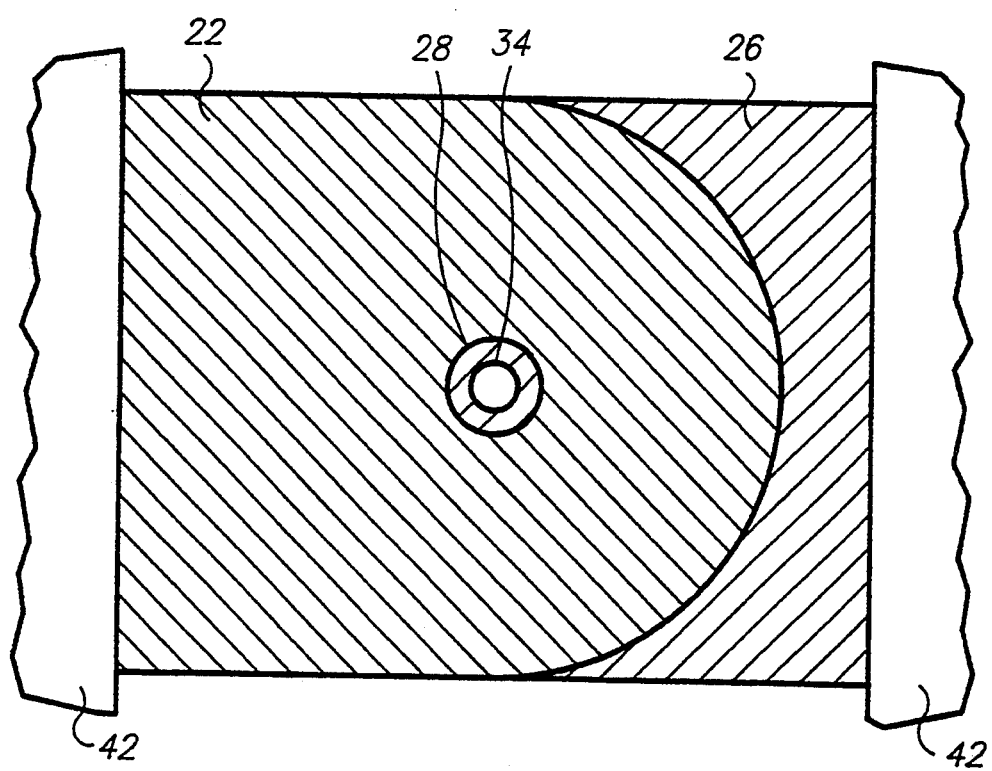

In FIGS. 6 and 6A, a three-plane, three-hole ion trap is shown where three parallel sheets, i.e., sheets 22, 24, and 26, each has a hole, i.e., holes 28, 32, and 34. All three holes are concentric with a common axis 38. The outer planes 22 and 24 are connected to a negative RF potential, while the inner plane 26 is connected to a positive potential. Three parallel sheets 22, 24, and 26 are separated on the outer edges by dielectric spacers 40 and are affixed to an insulative mounting and clamping assembly 42. There is no close-form analytical solution such as equation (1) to represent the potential for the three-hole trap. Nevertheless, similar potential curves are also obtained from a numerical solution for the Laplace equation for the three-hole trap. The results of the numerical solutions showed that the potential of the three-hole-trap is somewhat decreased in magnitude, but the resulting "potential well" as predicted was sufficient to accomplish the objects of this invention in constructing ion traps with planar configurations. The numerical solution predicts that a most symmetric potential results when the outer holes 28 and 32 are the same diameter and when the distance between all three planes is equal. These electrodes create a substantially quadrupole electric field which traps ions in the center of hole 34 on inner plane 26.

The dimensions of the sheets, the spacings, and the holes shown in FIG. 6 depict an actual three-hole planar ion trap configuration used to trap ions in an air experiment. The dimensions are as follows: The thicknesses of the plates 22, 24, and 26, and the spacers 40 are 0.003". The diameters of the outer holes 28 and 32 are 0.008", and that of the hole 34 is 0.004". The spacing between the edges of the clamps 42 is 0.062", clamps 42 is 0.062". The diameters of the semicircular end portions of the sheets 22, 24, and 26 arc .040".

Traps of this design have been constructed and operated successfully in air using charged aluminum particles and in an ultra-high vacuum with barium ions. In the air trap, the three sheets were made of beryllium copper, 2 mm square and 75 microns thick. The two outer sheets each has a 200 micron diameter hole centered on the 100 micron diameter hole of the inner sheet. Polished quartz blocks separate adjacent sheets by 100 microns. A potential of 1000 volts (peak to peak) at a frequency of 1 KHz is applied between the two outer sheets and the central sheet. Aluminum balls having a 10 micron diameter are charged in a capacitor, a small cylindrical enclosure facing a disk with a hole which accelerates their motion and allows their escape to the trap where they are captured. The position of an aluminum particle in the trap is easily observed through a microscope which views the scattered light of a He-Ne laser beam focused on the trap.

In the ultra-high vacuum trap, barium 138 ions were confined, laser cooled, and became physically observable in the three-hole trap constructed on three planes consisting of 75 micron thick beryllium copper sheets 2 mm wide. The holes in the outer planes were both 1600 microns in diameter, while the hole in the central plane was 855 microns in diameter. The plane-to-plane spacing was 1 mm and was fixed by fused quartz insulators which were ground and polished. An RF potential of 277 volts RMS at a frequency of 8.9 MHH$_2$ was applied between the planes. Neutral barium atoms were generated by evaporating a barium getter wire spaced 5 mm from the trap assembly. An electron gun with an energy of 250 electron volts and a current density of less than $10^{-4}$ amps/cm$^2$ created barium ions in the center of the trap by collision ionization. Two co-linear laser beams of beam waist radii of 75 microns were focused on the center of the trap for laser cooling and to observe the presence of the trapped ions. One beam had a wavelength of 493 nm and a power level of 100 microwatts and resonated with the 6 $^2S_{\frac{1}{2}}$ to 6 $^2P_{\frac{1}{2}}$ transition of the barium ion, while the second beam had a wavelength of 650 nm and a power level of 100 microwatts for driving the 6 $^2P_{\frac{1}{2}}$ to 5 $^2D_{3/2}$ transition. The entire assembly was placed in an ultra-high vacuum tank with a background pressure of less than 5×10 Torr. The trap assembly was viewed through a vacuum window by a microscope. The blue fluorescence of the barium ions could be readily seen by an observer.

One technical problem created by the small size of the planar traps is related to the high voltage drive. As the trap is made smaller, stable trapping motion results only if the frequency of the applied RF potential is increased. This results from the well-known Mathieu equation solutions for the ions in the trap. Traps of sizes from 100 microns to 10 microns envisaged require RF frequencies of from 100 MHz to 1 GHz. Generating and transporting approximately 1000 volts of RF at these frequencies is difficult, particularly since it must be passed into a high-vacuum chamber through a vacuum fitting or feedthrough.

Figure 7:
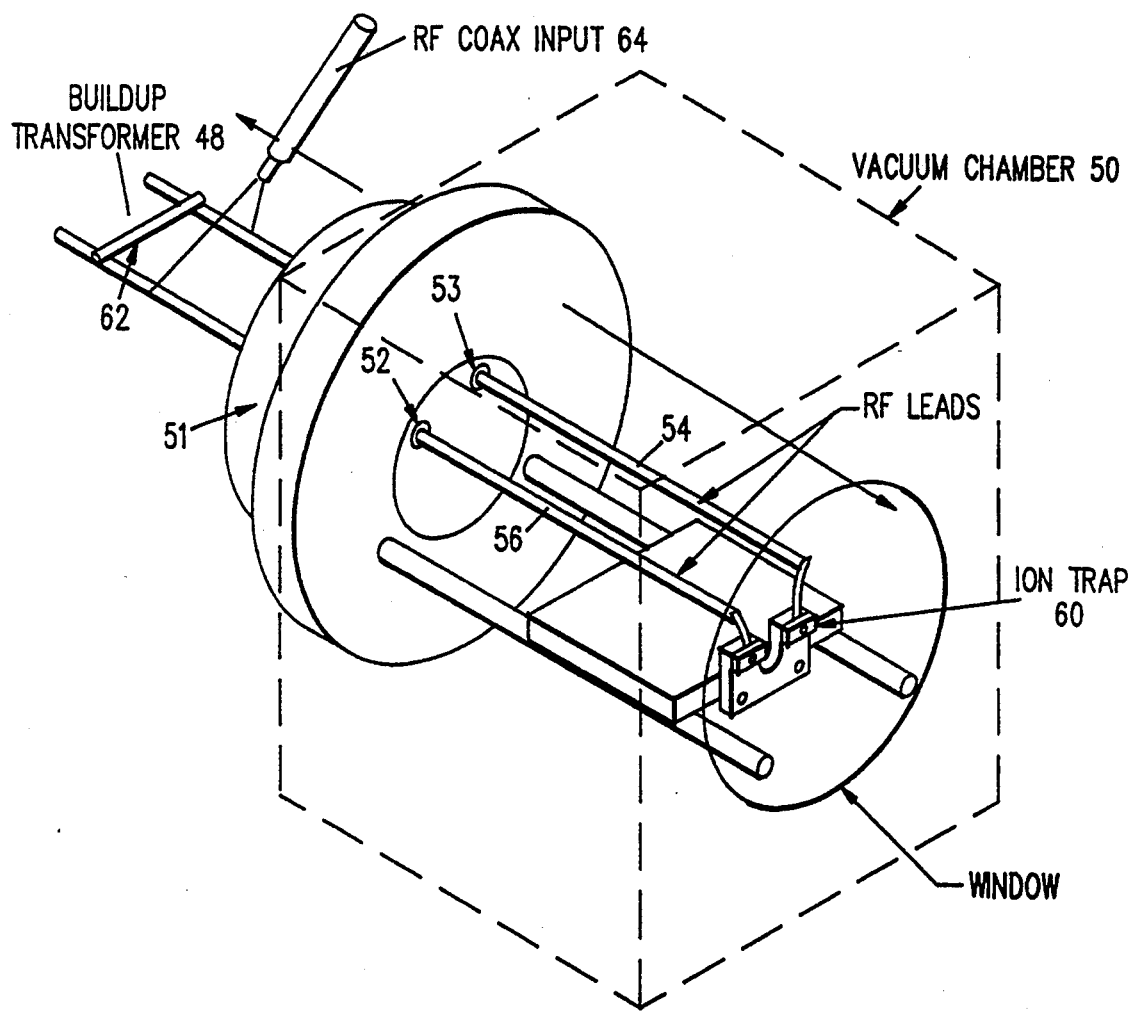
FIG. 7 shows a perspective view of the hole trap with the high RF voltage buildup wire transformer and the ultra-high vacuum feedthrough.

In the preferred embodiment, this problem is solved by making the feedthrough act as a high-Q resonant RF transformer which simultaneously carries the voltage into the vacuum system and also multiplies it by a factor of 40, i.e., 20 volts applied to the input 50 ohm side of the feedthrough is converted into 800 volts of RF at the trap. FIG. 7 shows a new high-Q resonant "feedthrough transformer" 48 feeding through a high-vacuum chamber 50 to provide high voltage at high frequency to a three-hole planar ion trap 60. Feedthrough transformer 48 consists of a commercial ultra-high vacuum feedthrough 51 (insulator seal part no. 9422032) which has two electric connectors 52 and 53. Inside vacuum chamber 50 two RF leads 54 and 56 are connected to electric connectors 51 and 52. RF leads 54 and 56 can be a pair of wired formed on low-loss 355 ohm RF transmission line. RF leads 54 and 56 are connected to the positive and negative terminals of ion trap 60 form the open-circuited end of the transmission line. Outside vacuum chamber 50 two electric wires of build-up transformer 48 are shorted together at an appropriate resonant length (a total of 31.5 cm for trap 60 to resonate at 150 MHz) to form an L/4 transmission line resonator 62. A connection to a 50 ohm coaxial transmission line 64 is made close to the short. The distance is chosen to match the combined trap and feedthrough to 50 ohms. At 150 MHz, this distance was 1.5 cm. An additional balance transformer of standard design (not shown) can also be used to balance and match the system to 200 ohms.

Ion traps having a geometry of parallel planes can be fabricated lithographically. It is for this reason that ion trap and integrated circuit technology can now be wed, resulting in a small chip containing the trap, diode lasers, and associated electronics.

Lithographic fabrication begins, for example, with a silicon wafer 5" by 0.025", i.e., $625\mu^2$. Its two surfaces are coated, first by vacuum deposition with silicon nitride (SiN) to a $1\mu$ thickness and then with a photoresist, a liquid that is spun onto a $2\mu$ thickness. An optical image of a mask, in this case a $1000\mu$ diameter disk, sensitizes one of the surfaces which is then removed with a developer. The underlying $1000\mu$ diameter SiN disk is then removed by a dry reactive ion etching procedure. This step is followed by wet etching with KOH that removes an Si cylinder, $1000\mu$ times $625\mu$, down to a drum, the second SiN surface, i.e, the removal is in the vertical and not the horizontal direction. The overlying photoresist is exposed to the optical image of a second mask, a sheet with a $100\mu$ diameter hole, and again with a developer, all but the hole is removed. The entire surface, which is now mostly SiN and a $100\mu$ diameter disk of photoresist, is coated with a metal such as copper to a depth of $1\mu$. Application of a solvent removes the remaining photoresist and the overlying metal. What remains on the SiN drum is a metal film with a $100\mu$ hole. The SiN in the hole area is removed by dry ion etching. In this way, each of the three trap electrodes is formed, and when held together in a clamp, a trap results.

Figure 1:
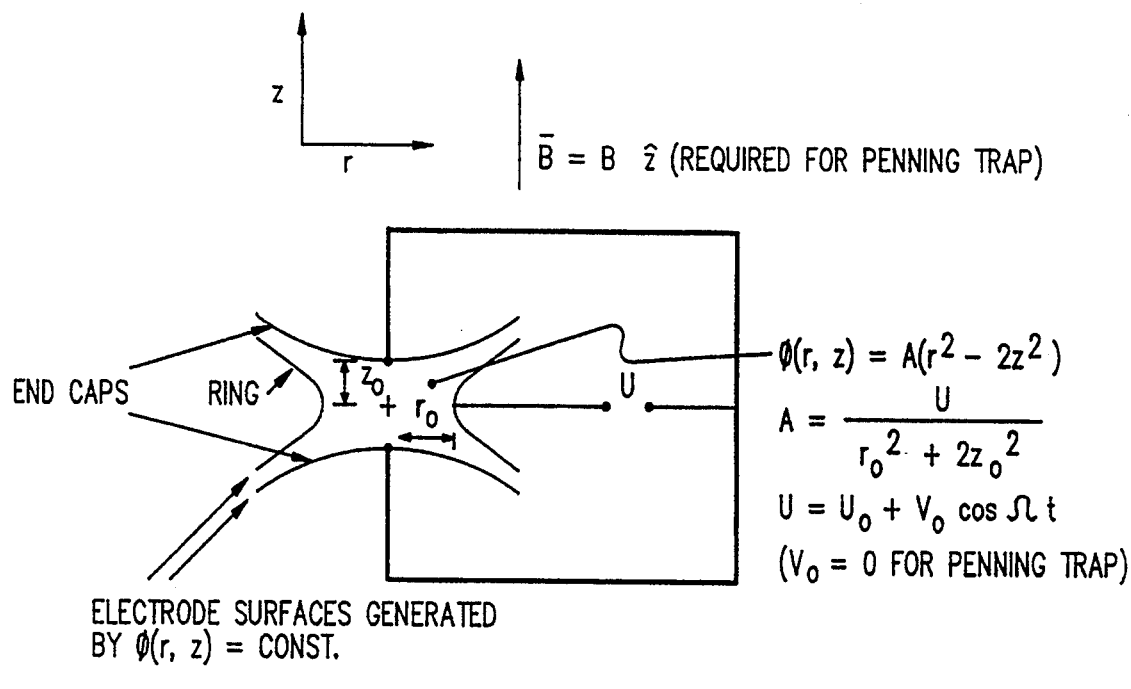
FIG. 1 shows the electrode configuration of the Paul trap and Penning trap with hyperboloid ring and end cap electrodes.
Figure 2:
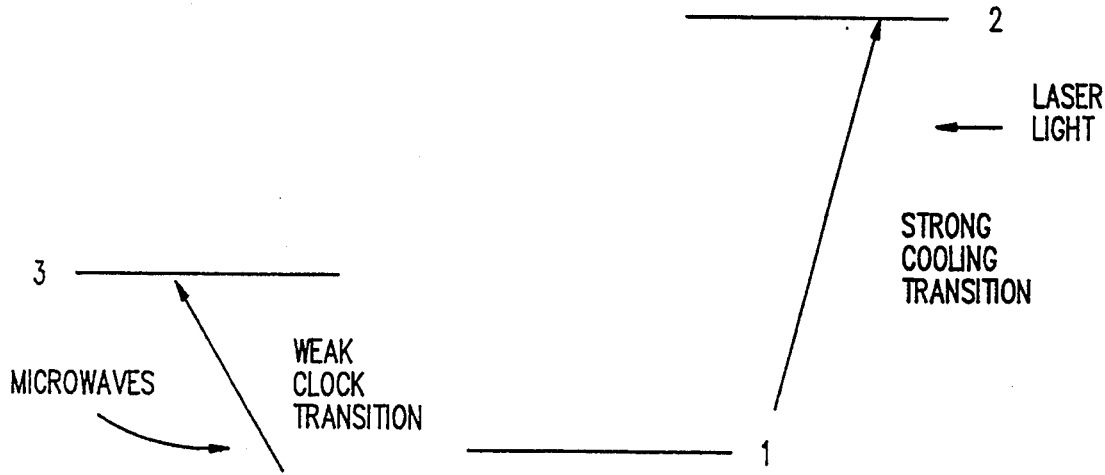
FIG. 2 shows an atomic energy level diagram utilized in a laser-cooled ion trap atomic clock.
Figure 3:
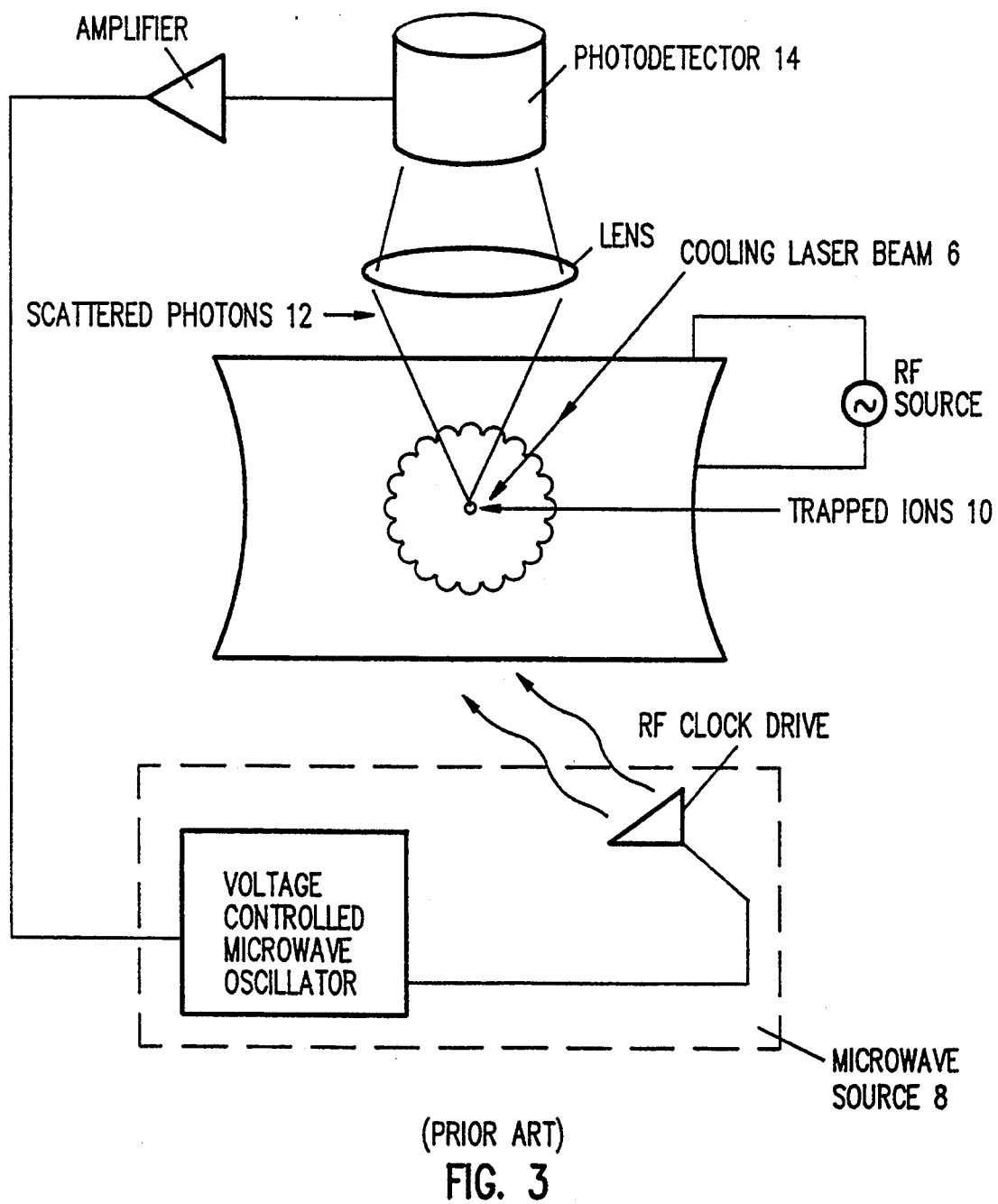
FIG. 3 shows a block diagram of a typical laser-cooled ion trap clock system.
Figure 8:
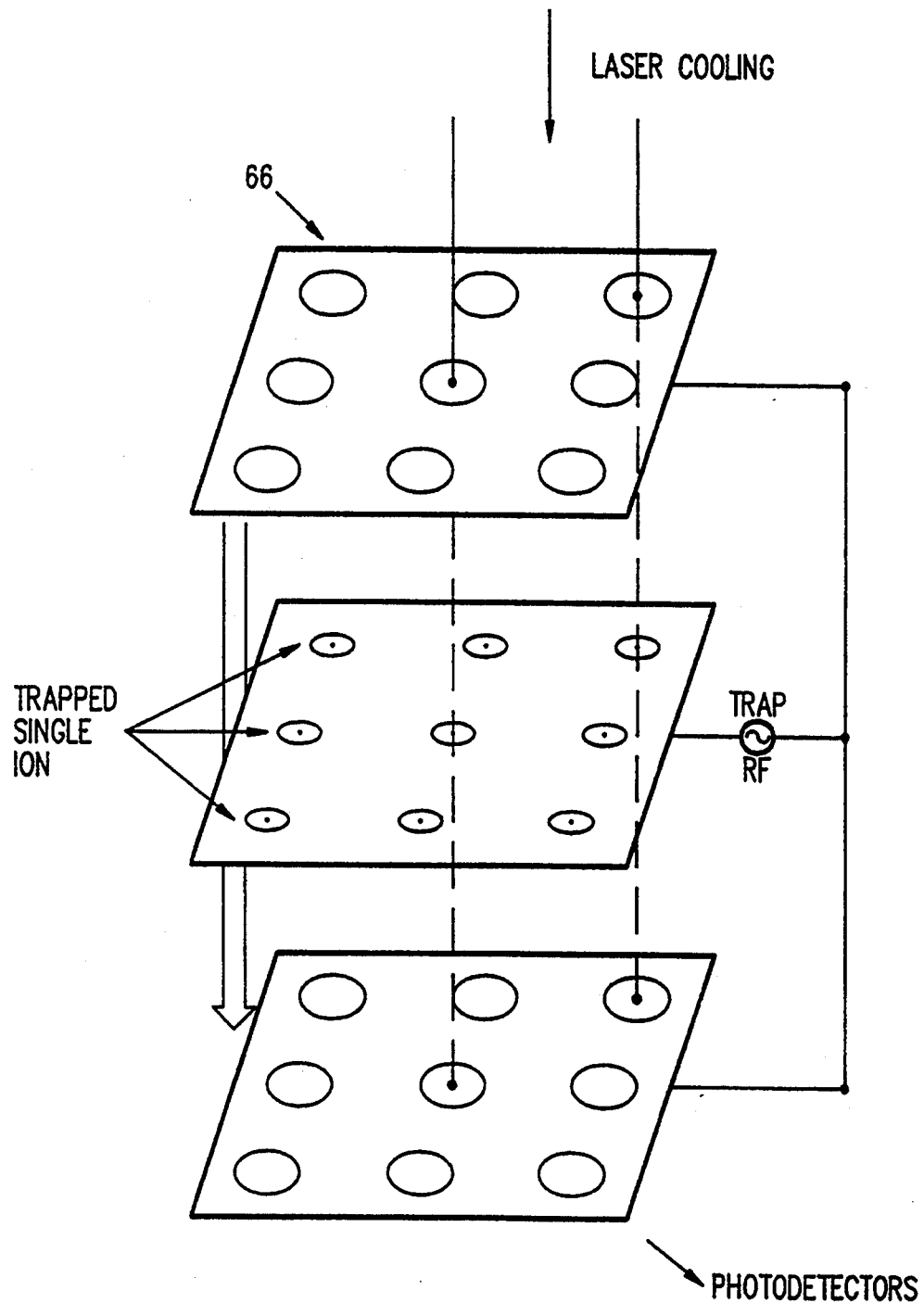
FIG. 8 shows the laser-cooled atomic clock utilizing an array of planar iontraps manufactured by lithography.
Figure 9:
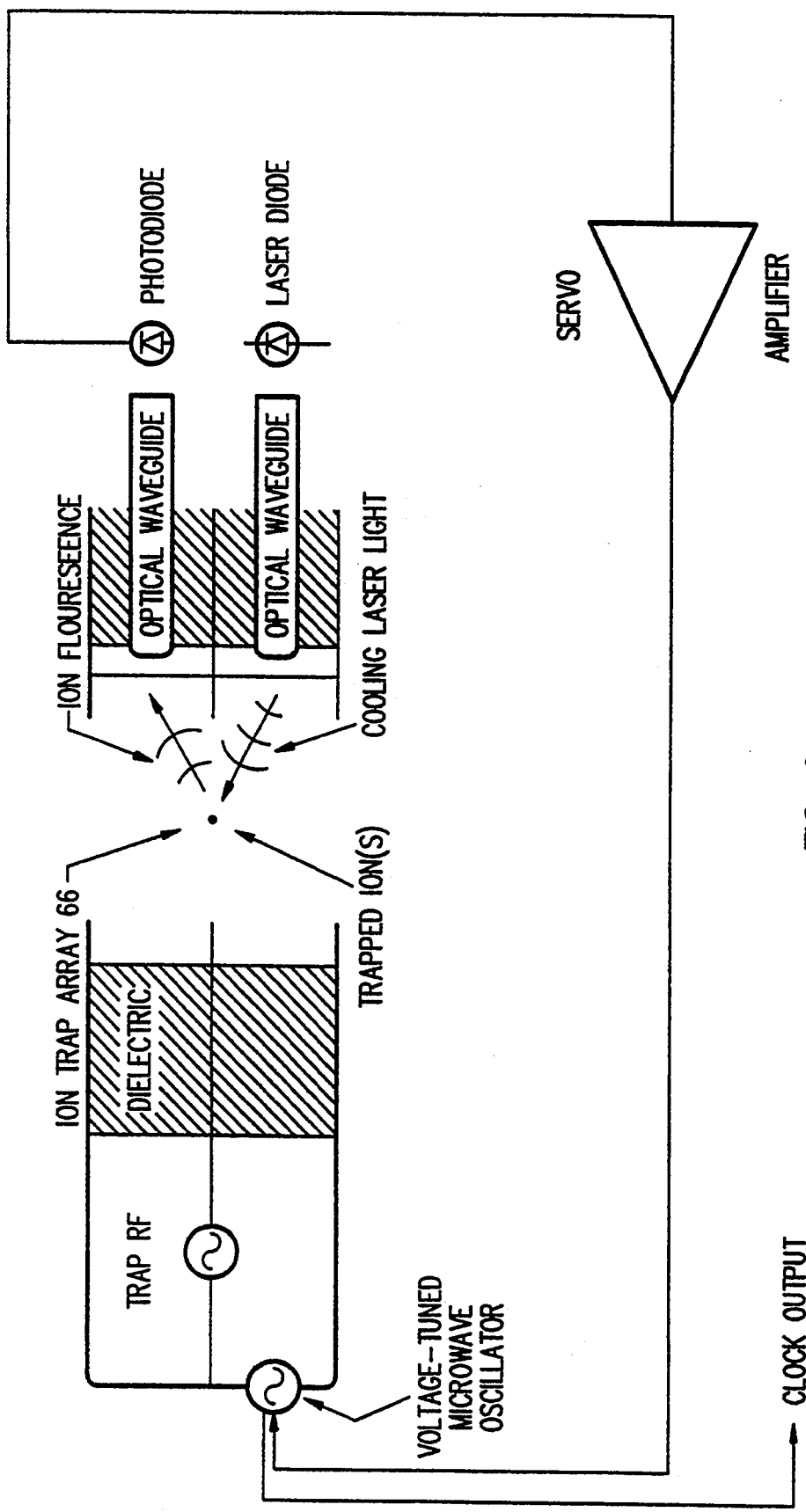
FIG. 9 shows a block diagram of a laser-cooled ion trap clock system where an array of three-hole planar traps is used.

By the use of suitable masks, an array of three-hole traps as shown in FIG. 8 is fabricated. An array of three-hole ion traps 66 is fabricated with the lithographical processes and then integrated to form an ion-trap clock system as shown in FIG. 9. The basic system configuration and functions of each component are similar to those shown in FIG. 3 which are well known in the prior art, except that the iontrap is now replaced by an array of three-hole ion traps 66 fabricated by a lithographical technique. It is to be noted that the emission and the detection of the scattered photons in each individual ion trap are happening at a rate of a few thousand times a second, while the servo control method for locking the microwave frequency to the clock shift utilizes a slow varying signal corresponding to the average rate of spontaneous emission of the scattered photons detected by the photo-detector.

As laser cooling is disclosed in the above embodiments, it is obvious to those skilled in the art that other kinds of cooling techniques including, but not limited to, buffer gas cooling, electromagnetic cooling, and "sympathetic cooling" (D. J. Larson, et. al., Phy. Rev. Letters Vol. 57, p. 70, 1986) may also be applied to reduce the kinetic energy of the confined ion and increase the precision of the frequency measurement and its application in the atomic clock.

With ion trap arrays, this invention provides a solution to another limitation of the prior art. When more than one ion is loaded into a trap, the ions interact with each other through their Coulomb repulsion and acquire large velocities due to the trap potentials which cannot be removed by laser cooling. In fact, laser cooling itself tends to fail when more than several dozens ions are loaded. This creates Doppler shifts and broadening which form a well-know limitation of trap accuracy. Laser cooling works best for only a single ion in each trap. However, as noted above, a single ion has a poor signal-to-noise ratio because of the quantum limit on detection noise first noted by Wineland. An ideal trap would be composed of many separate single ion traps whose signals could be added together. In this way each ion would be isolated from the others for low systematic errors, but a good signal-to-noise ratio would result. The ability to construct an ion trap using photo-lithographic technology allows the simultaneous construction and operation of thousands or perhaps millions of identical single ion trap, with a many order-of-magnitude increase in accuracy.

Figure 10:
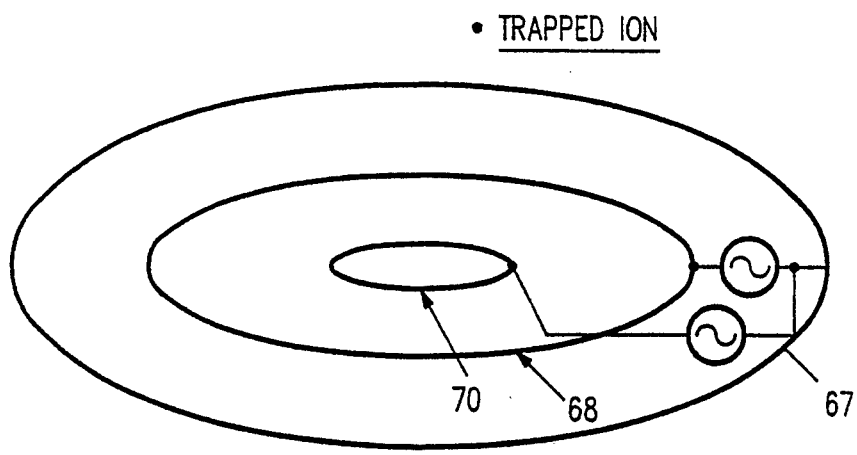
FIG. 10 shows a single-plane ion trap having multiple concentric rings disposed on the same plane with one trapped ion floating above the plane.

FIG. 10 shows a three-ring planar ion trap having three concentric rings on a singular plane. The outer rings 67 and 68 are connected to a positive RF voltage and the inner ring 70 is connected to a negative RF voltage. A quadrupole electric field is formed in the space right above inner ring 70. An ion injected into the space is confined and remains "floating" above inner ring 70.

Figure 11:
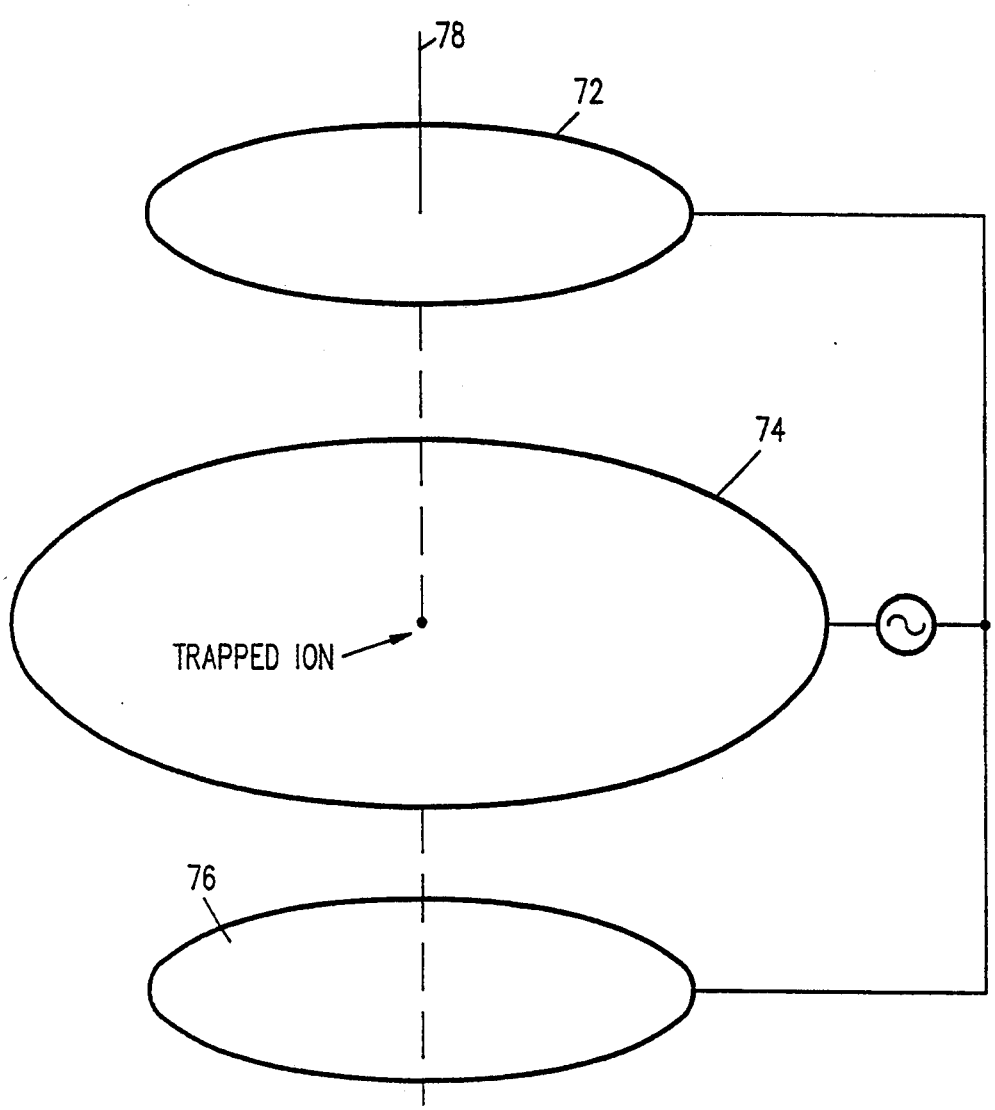
FIG. 11 shows a multi-plane ring ion trap having three rings disposed on three parallel planes with an ion trapped in the space defined by the three rings.

FIG. 11 shows a three-ring ion trap comprising three rings, i.e., rings 72, 74, and 76, disposed on three substantially parallel planes and aligned substantially along a common axis 78. Two outer rings 72 and 76 are connected to a positive RF voltage and inner ring 74 to a negative voltage. As shown, the outer rings 72 and 76 are preferably have radii of the same magnitude. A quadrupole electric field is established around the center of inner ring 74, whereby an ion being injected into the space surrounded by inner ring 74 is confined and remains trapped in that space by the electric field.

An analysis of the tuning of the embodiment of FIG. 11 will now be provided. For the following discussion, it is assumed that the rings are infinitely small in cross section. For real-life embodiments of the trap, in which the rings have finite cross-sectional dimensions, suitable adjustments may be made to the calculations outlined here.

The potential of a charged ring is given by the following equation:

$$\Phi(r, \theta) = \frac{q}{r_o} \left\{ \sum_{n=0}^{\infty} \left(\frac{r}{r_o}\right)^n P_n(\cos\theta_o) P_n(\cos\theta) \right\}$$

For three rings as shown in FIG. 11, the sum of the potential for all three rings is given by the following equation:

$$\Phi(r, \theta) = \frac{2q}{r_o} \left\{ a_0 + a_2 \left(\frac{r}{r_o}\right)^2 P_2(\cos\theta) + \right.$$

-continued $$a_4 \left(\frac{r}{r_0}\right)^4 P_4(\cos\theta) + a_6 \left(\frac{r}{r_0}\right)^6 P_6(\cos\theta) +$$

$$a_8 \left(\frac{r}{r_0}\right)^8 P_8(\cos\theta) \Bigg\}$$

Figure 11A:
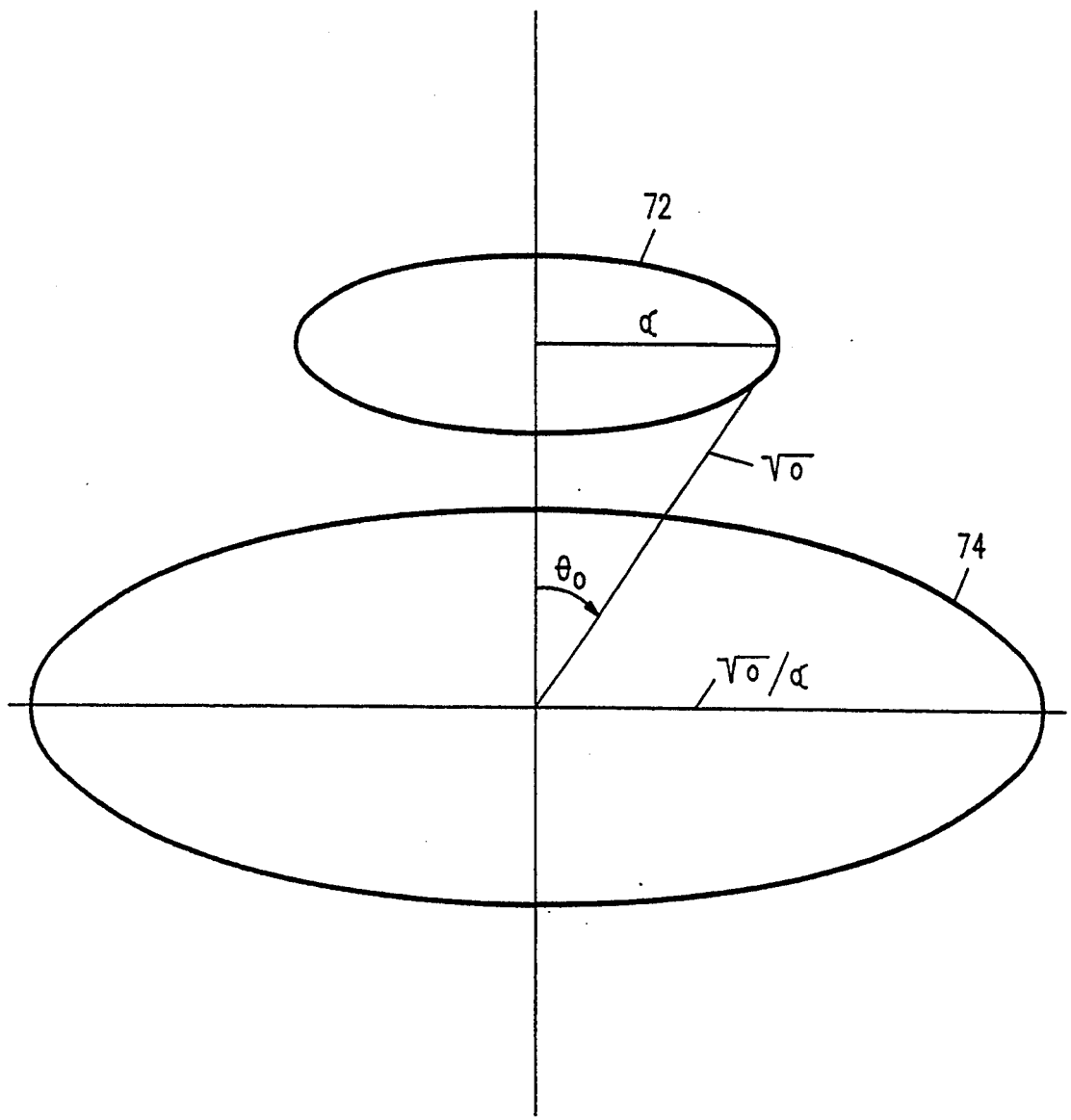
FIG. 11A shows a portion of the ion trap of FIG. 11, including definitions of various geometric variables relating to the structure of the trap.

The variables used in these two equations are illustrated in FIG. 11A, which shows the upper ring 72 and a portion of the larger middle ring 74. The radius of the ring 72 is a. The line segment $r_0$ is the distance between the center of the ring 74 and a point on the ring 72. The angle $\theta_0$ is the angle between $r_0$ and the axis running through the centers of the two rings 72 and 74. The radius of the ring 74 is $r_0/\alpha$. $\alpha$ is therefore the ratio of the radii of the rings 72 and 74. $\alpha$ is less than 1 if the radius of the ring 74 is greater than that of the ring 72. The variable q represents a charge on the rings 72 and 76, and $-2q$ is a charge on the inner ring 74.

The coefficients $a_0$, $a_2$, $a_4$, $a_6$, and $a_8$ are given by the following expressions:

$$a_0 = 1 - \alpha$$

$$a_2 = P_2(\cos\theta_0) + \frac{\alpha^3}{2}$$

$$a_4 = P_4(\cos\theta_0) - \tfrac{3}{8}\alpha^5$$

$$a_6 = P_6(\cos\theta_0) + 5/16\alpha^7$$

$$a_8 = P_8(\cos\theta_0) - 35/128\alpha^9$$

In summary, according to this model of the ion trap configuration of FIGS. 11 and 11A, two independent parameters, $\theta_0$ and $\alpha$, may be varied. In effect, by selecting values for these two variables, ratios between the radii of the two rings and the distance between their respective planes are set. Therefore, values can be selected such that the fourth-order and sixth-order coefficients $a_4$ and $a_6$ can be set to 0. In the solutions which appear below, the dimensions are expressed as multiples of a, the radius of the ring 72. The variable a may have any suitable value, and is used only to indicate that the dimensions are expressed relative to each other, rather than in terms of absolute values.

It will be understood that these expressions cannot be solved analytically. However, numerical approximations have produced usable values from the preceeding equations which have been used to produce tuned traps of high stability. Numerical solutions are approximate, by their nature. Where approximate values are given for the various parameters, it will be understood that variations in values which arise from differing numerical approximations derived from the equations given herein and which provide comparable trap stability are to be considered within the spirit and scope of the invention as recited in the appended claims and disclosed herein. It is further to be understood that variations on the order of 10% from those given in accordance with the analyses provided herein fall within the spirit and scope of the invention as regards the general geometric configurations for the respective traps.

In one instance, the values $\theta_0 = 24.68°$ and $\alpha = 0.930$ have been used. These values produce coefficients $a_0 = 0.070$, $a_2 = 0.738$, $a_4 < 0.001$, and $a_6 < 0.001$. The potential for all three rings is then $$\Phi(r,\theta) = \frac{2q}{r}\left\{.07 + .738\left(\frac{r}{r_0}\right)^2 P_2(\cos\theta) + \ldots\right\}$$

This is a nearly perfect quadrupole potential where $$r_0 = \frac{a}{\sin(\theta_0)} = 2.40\, a,$$

and the radius of the ring 74 is 2.58a. The height of the ring 72 is $$\frac{a}{\tan}(\theta_0) = 2.18a.$$

If an ion trap structure employing rings is used, such as that in FIG. 11, then additional field components are generated from wires coupling the rings to the RF voltage source or sources. Alternative versions of the traps which employ sheets of conductive material having holes corresponding in size and configuration to the rings may be employed to reduce or eliminate these additional field components.

Figure 11B:
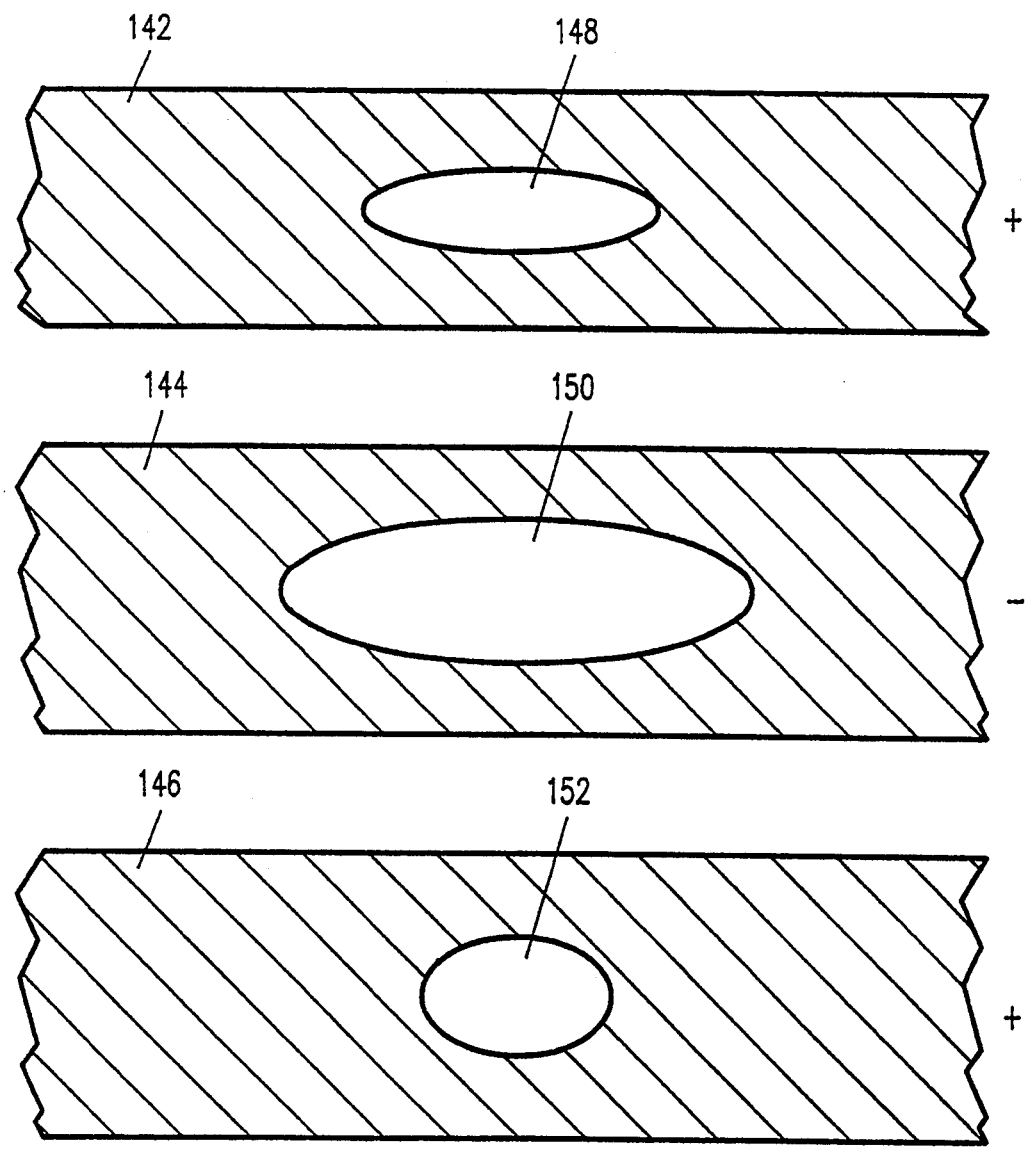
FIG. 11B shows a three-plane three hole ion trap having three parallel sheets with circular holes in each sheet.

For instance, FIG. 11B shows a trap comprising three sheets of conductive material 142, 144, and 146, which have holes 148, 150, and 152 that respectively correspond to the rings 72, 74, and 76 of FIG. 11. Each sheet, with its hole, produces a potential given by the following equation:

$$\sum_{l=0}^{\infty} \left(\frac{r}{r_0}\right)^l a_l P_l(\cos\theta)$$

In this embodiment, the coefficients $a_l$ are different from those given above, but are related to the Legendre polynomials. Thus, suitable ratios between the hole radii and distances between sheets also may be selected to minimize or eliminate the fourth- and sixth-order field components.

Figure 12:
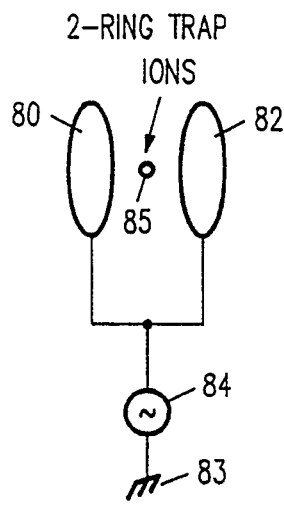
FIG. 12 shows a multi-plane ring ion trap having two rings disposed on two parallel planes with an ion trapped in the space between the two rings.

FIG. 12 shows a two-ring trap which comprises two rings 80 and 82, which are made of electrically conductive material disposed on two substantially parallel planes, and aligned substantially concentrically along a common axis. The two-ring trap also has a means for impressing an RF potential between the two rings 80 and 82, and ground. The means for impressing is shown as an RF voltage source 84. The rings 80 and 82 are electrically connected together so that they are at the same potential. Ground, shown as a distant ground electrode 83, has a shape which is not critical. Preferably, the two rings 80 and 82 have radii of the same length. The spacing between the rings 80 and 82 is adjusted as a function of the radii of the rings such that the resulting electric field being generated in the space between the rings has the characteristic of a substantially quadrupole field up to the sixth harmonic order, whereby a charged particle 85, in being injected into the space, is confined in the field, maintaining a dynamic equilibrium condition.

Figure 12A:
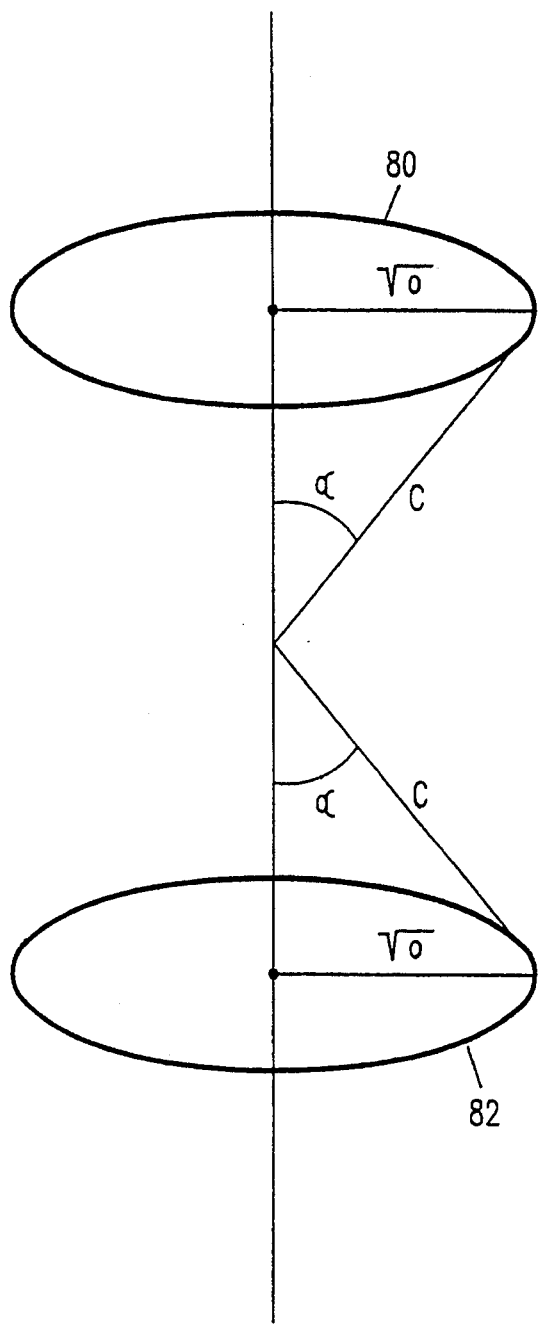
FIG. 12A shows the ion trap of FIG. 12, including definitions of various geometric variables relating to the structure of the trap.

The ion trap configuration of FIG. 12 also may be tuned to reduce or eliminate higher-order field components. FIG. 12A illustrates variables to be used in the following analysis. The rings 80 and 82 each have a radius $r_0$. An axis runs through the centers of the two rings. A distance from a mid-point on the axis between the centers of the rings 80 and 82 to a point on either of the rings is shown as a line segment c. Finally, the angle between a line segment c and the axis is given as $\alpha$. Additionally, the rings 80 and 82 are separated by a distance s.

Given this configuration, the trap potential is given in terms of Legendre polynomials as follows:

$$\Phi(r, \theta) = \frac{Q}{c} \sum_{l=0}^{\infty} \left(\frac{r}{c}\right)^l P_l(\cos \alpha) P_l(\cos \theta)$$

For the trap configuration of FIG. 12, values of a are sought so that the fourth-order field component, $P_4 \cos(\alpha)=0$. It may be determined numerically that two values of $\alpha$ satisfy this condition. They are $\alpha_1=70.13°$ and $\alpha_2=30.55°$. The Legendre series for these two solutions are as follows:

$$\Phi_1(r, \theta) = \frac{Q}{c_1} \left\{ 1 - .327 \left(\frac{r}{c}\right)^2 P_2(\cos \theta) + 0 \times P_4 + \right.$$

$$\left. .205 \left(\frac{r}{c}\right)^6 P_6(\cos \theta) - .277 \left(\frac{r}{c}\right)^8 P_8(\cos \theta) \right\}$$

$$\Phi_2(r, \theta) = \frac{Q}{c_2} \left\{ 1 + .612 \left(\frac{r}{c}\right)^2 P_2(\cos \theta) + 0 \times P_4 - \right.$$

$$\left. .385 \left(\frac{r}{c}\right)^6 P_6(\cos \theta) - .320 \left(\frac{r}{c}\right)^8 P_8(\cos \theta) \right\}$$

In these expressions, $c=r_0/\sin\theta$, $c_1=r_0/0.9405=1.063 r_0$, and $c_2=r_0/0.5083=1.967 r_0$. Accordingly, two different distances s, relative to the radius $r_0$, suppress the fourth-order field component. In these two cases, $s=0.723\ r_0$, and $s=3.39\ r_0$. Rings having radii of 200 microns ($200\mu$) have been used. The two ring separation distances s corresponding with this radius are $s=145\mu$ and $s=678\mu$. Voltage efficiencies of these traps can be determined by numerical integration, employing the ring-to-ring capacitance.

Figure 13:
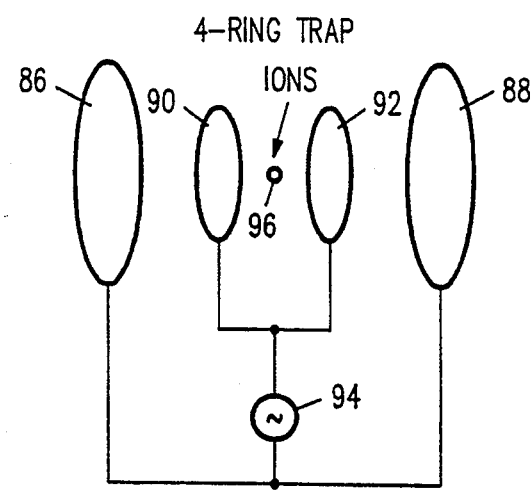
FIG. 13 shows a multi-plane ring ion trap having four rings disposed on four parallel planes with an ion trapped in space between the inner rings.

FIG. 13 shows a four-ring trap which comprises two outer rings 86 and 88 and two inner rings 90 and 92, which are made of electrically conductive material and disposed on four substantially parallel planes. The four rings are aligned substantially concentrically along a common axis. The four-ring trap also has a means for impressing an RF potential between the two inner rings 90 and 92 and the two outer rings 86 and 88, shown as an RF voltage source 94. The inner rings 90 and 92 which are electrically connected together so that they are at the same potential, and the two outer rings 86 and 88 are also connected together so that they are at the same potential. Preferably, the two inner rings 90 and 92 have radii of the same length and the two outer rings 86 and 88 have radii of the same length. The spacing and radii of the inner and outer rings is adjusted such that the resulting electric field being generated in the space between the two inner rings 90 and 92 has the characteristic of a substantially quadrupole field up to the sixth harmonic order, whereby a charged particle 96, in being injected into the space, is confined in the field, maintaining a dynamic equilibrium condition.

The four-ring trap of FIG. 13 simulates the two-hole trap of FIG. 12, in which additional electrodes, charged with the opposite polarity of the rings 80 and 82, are positioned at infinity, as with the Paul-Straubel trap. In the embodiment of FIG. 13, the two outer rings 86 and 88 have radii larger than those of the inner rings 90 and 92, which correspond to the rings 80 and 82 of FIG. 12. The dimensions of the outer rings 86 and 88 are not critical. Outer rings having a diameter of 1 mm to 1 cm have been used along with inner rings having $100\mu$ radii.

Figure 14:
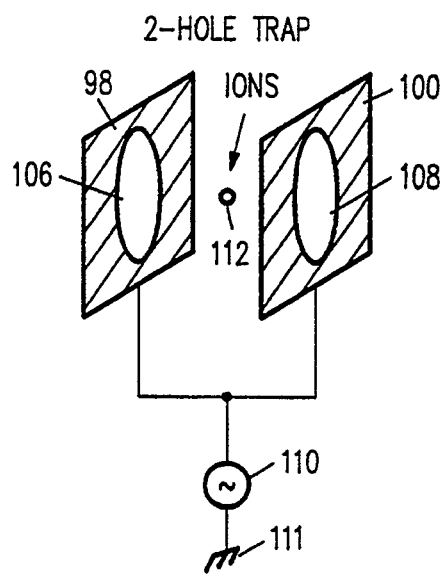
FIG. 14 shows a two-plane two hole ion trap having two parallel sheets with circular holes on both sheets and with an ion trapped in the space between the two holes.

FIG. 14 shows a two-hole trap which comprises two parallel, electrically conductive sheets 98 and 100. In the embodiment shown, air in between the sheets serves as a dielectric. Alternatively, dielectric members may be disposed on the outer edges of the sheets 98 and 100. The two sheets 98 and 100 have circular holes 106 and 108, which are symmetrcially aligned substantially along a common axis. The two-hole trap also has a means for impressing an RF potential between the two sheets and ground, shown as an RF voltage source 94. The two sheets 98 and 100 are electrically connected together so that they are at the same potential. Ground is shown as a distant ground electrode 1 1 1, whose shape is not critical. The spacing between the two sheets 98 and 100 is adjusted as a function of the radii of the holes 106 and 108 such that the electric field being generated in the space between the holes has the characteristic of a substantially quadrupole field up to the sixth harmonic order, whereby a charged particle 112, in being injected into the space, is confined in the field, maintaining a dynamic equilibrium condition.

Figure 15:
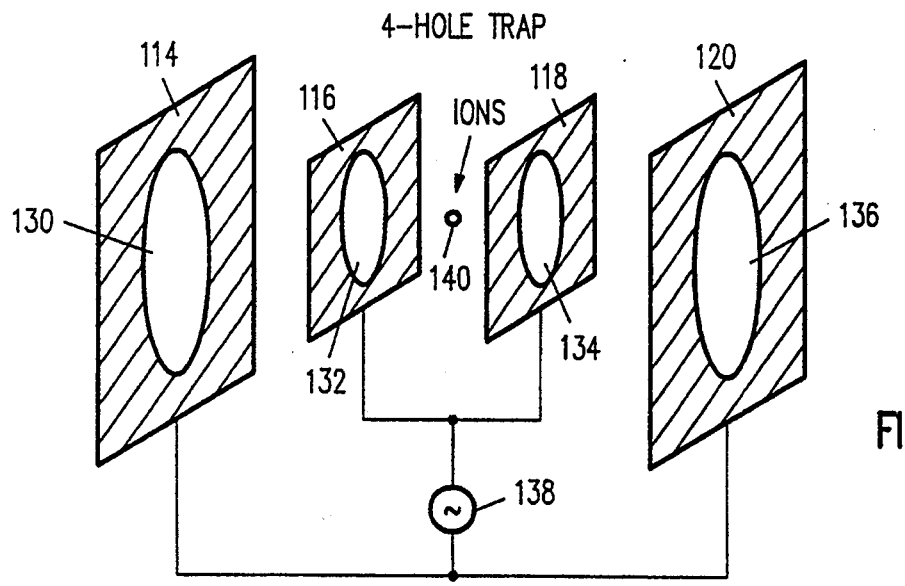
FIG. 15 shows a four-plane four hole ion trap having four parallel planes with one circular hole on each sheet and with an ion trapped in the space between the two inner holes.

FIG. 15 shows a four-hole trap which comprises four parallel, electrically conductive sheets 114, 116, 118, and 120. In the embodiment shown, air in between the sheets serves as a dielectric. Alternatively, dielectric members may be disposed on the outer edges of the sheets 114, 116, 118, and 120, respectively. Each of the four sheets has a circular hole. The circular holes, shown as 130, 132, 134, and 136, are symmetrcially aligned substantially along a common axis. The two inner holes 132 and 134 are of substantially the same radius, and the two outer holes 130 and 136 are also of substantially the same radius. The four hole trap also has a means for impressing an RF potential between the two inner sheets 116 and 118, and the two outer sheets 114 and 120. The two inner sheets 116 and 118 are electrically connected together so that they are at the same potential, and the two outer sheets 114 and 120 are also electrically connected together so that they are at the same potential. The spacing between the sheets is adjusted as a function of the radii of the holes such that the electric field being generated in the space between the inner holes 132 and 134 has the characteristic of a substantially quadrupole field up to the sixth harmonic order, whereby a charged particle 140, in being injected into the space, is confined in the field, maintaining a dynamic equilibrium condition.

While the preferred embodiments of the present invention have been described as the above in detail, it should be apparent to those who are skilled in the art that modifications and adaptions to those embodiments may occur without departing from the scope of the present invention as set forth in the following claims.

We claim:

1. An ion trap atomic clock system comprising:
   at least one ion having at least three energy levels, wherein a first energy level is the lowest, a third energy level is sightly higher, and a second energy level is substantially higher than the first and the third energy levels, said ion further having a resonant atomic energy level transition between the first and the second levels and a resonant atomic energy levels transition between the first and the third levels;

a planar ion trap including three electrically conductive sheets with one inner sheet disposed between two outer sheets, said three sheets being substantially parallel to each other having dielectric spacers disposed on the outer edges of said sheets separating one sheet from another, each of the three sheets having a circular hole and said circular holes being symmetrically aligned substantially along a common axis;

a first and a second electrically conductive RF leads said first lead connected to the two outer sheets and said second lead connected to the inner sheet;

an electrically insulative mounting and clamp assembly affixed to said three sheets and said RF leads;

a vacuum chamber capable of enclosing and generating a high vacuum in the space therein, enclosing the mounting and clamp assembly, the three sheets, and the RF leads, said vacuum chamber further having a vacuum feedthrough, said vacuum feedthrough including a first and a second electrical connector Connecting to the first and the second RF leads, respectively, enclosed in the vacuum chamber;

an RF voltage build-up transformer including first and second conducting lines, said first and second conducting lines connecting to the first and second electrical connectors, respectively, said conducting lines further connected to an RF power supply with the first connecting line connected to a positive voltage source and the second conducting line connected to a negative voltage source of said RF power supply;

said first and second conducting lines being substantially parallel to each other and functioning as a voltage build-up transformer whereby a high voltage RF field is generated between said two conducting lines;

said two conducting lines being further in electrical connection to the three sheets through the RF leads and the electric connectors of the vacuum feedthrough for generating a substantially quadrupole electrical field in the space near the three holes whereby a charged particle, being injected into the space, is confined in said field, maintaining a dynamic equilibrium condition;

a laser source irradiating a laser beam having slightly less energy than the resonant atomic energy level transition between the first and the second energy levels of the confined ion, said laser beam being irradiated into the planar ion trap and being selected and adjusted for absorption by the confined ion resulting in an atomic energy transition from the first energy level to the higher and more unstable second energy level, the ion decaying to either the first or the third energy levels having a greater probability of decaying to the first energy level and spontaneously emitting a scattered photon, said scattered photon emission causing the confined ion to have a kinetic energy loss resulting in a laser cooling of the ion;

a photodetector disposed near the ion trap for detecting the spontaneous emission of the scattered photon;

an RF microwave source irradiating a sequence of microwaves into the ion trap, said microwaves being selected and controlled having an energy equivalent to the resonant atomic energy level transition between the first and the third levels for absorption by the ion for inducing an ionic energy level transition from the first energy level to the third energy level so that in reducing the probability of having an atomic energy transition from the first energy level to the second energy level resulting in reduced spontaneous emission of the scattered photons;

a voltage-controlled microwave oscillator connected to the RF microwave source and the photo dectector for receiving an input signal from the photodetector corresponding to the spontaneous emission of the scattered photons, the microwave oscillator adjusting and controlling the frequency of the RF microwave source for minimizing the emission of the scattered photons from the second energy level whereby the microwave frequency irradiated from the RF microwave is servo controlled, having a frequency locked and resonating with the energy level transition between the first and the third energy levels of the confined ion.

2. An ion trap atomic clock system as defined in claim 1, wherein the planar ion trap is an array of planar ion traps disposed on three substantially parallel sheets with each ion trap confining at least one ion therein.

3. An ion trap atomic clock system comprising:
at least one ion having at least three energy levels, wherein a first energy level is the lowest, a third energy level is sightly higher, and a second energy level is substantially higher than the first and the third energy levels, said ion further having a resonant atomic energy level transition between the first and the second levels and a resonant atomic energy level transition between the first and the third levels;

a planar ion trap including three electrically conductive sheets with one inner sheet disposed in between two outer sheets, said three sheets being substantially parallel to each other having dielectric spacers disposed on the outer edges of said sheets separating one sheet from another, each of the three sheets having a circular hole and said circular holes being symmetrically aligned substantially along a common axis;

a first and a second electrically conductive RF lead, said first lead connected to the two outer sheets and said second lead connected to the inner sheet;

an electrically insulative mounting and clamp assembly affixed to said three sheets and said RF leads;

a vacuum chamber capable of enclosing and generating a high vacuum in the space therein, enclosing the mounting and clamp assembly, the three sheets, and the RF leads, said vacuum chamber further having a vacuum feedthrough, said vacuum feedthrough including a first and a second electrical connector connecting to the first and the second RF leads, respectively, enclosed in the vacuum chamber;

an RF voltage build-up transformer including first and second conducting lines, said first and second conducting lines connecting to the first and second electrical connectors, respectively, said conducting lines further connected to an RF power supply with the first connecting line connected to a positive voltage source and the second conducting line connected to a negative voltage source of said RF power supply;

said first and second conducting lines being substantially parallel to each other AND functioning as a voltage build-up transformer whereby a high voltage RF field is generated between said two conducting lines;

said two conducting lines being further in electrical connection to the three sheets through the RF leads and the electric connectors of the vacuum feedthrough for generating a substantially quadrupole electrical field in the space near the three holes whereby a charged particle, being injected into the space, is confined in said field, maintaining a dynamic equilibrium condition;

a laser source irradiating a laser beam having slightly less energy than the resonant atomic energy level transition between the first and the second energy levels of the confined ion, said laser beam being irradiated into the planar ion trap and being selected and adjusted for absorption by the confined ion resulting IN an atomic energy transition from the first energy level to the higher and more unstable second energy level, the ion decaying to either the first or the third energy levels having a greater probability of decaying to the third energy level and spontaneously emitting a scattered photon, said scattered photon emission causing the confined ion to have a kinetic energy loss resulting in a laser cooling of the ion;

a photodetector disposed near the ion trap for detecting the spontaneous emission of the scattered photon;

an RF microwave source irradiating a sequence of microwaves into the ion trap, said microwaves being selected and controlled having an energy level equivalent to the resonant atomic energy level transition between the first and the third levels for absorption by the ion for inducing an ionic energy level transition from the third energy level to the first energy level so that increasing the probability of having an atomic energy transition from the first energy level to the second energy level results in increased spontaneous emission of the scattered photons; and a voltage-controlled microwave oscillator connecting to the RF microwave source and the photo dectector for receiving an input signal from the photo detector corresponding to the spontaneous emission of the scattered photons, the microwave oscillator adjusting and controlling the frequency of the RF microwave source for maximizing the emission of the scattered photons from the second energy level whereby the microwave frequency irradiated from the RF microwave is servo controlled, having a frequency locked and resonating with the energy level transition between the first and the third energy levels of the confined ion.

4. An ion trap atomic clock system as defined in claim 3, wherein the planar iontrap is an array of planar ion traps disposed on three substantially parallel sheets with each ion trap confining at least one ion therein.

* * * * *